(12) United States Patent
Kurbanov et al.

(10) Patent No.: US 8,187,488 B2
(45) Date of Patent: *May 29, 2012

(54) ELECTRET COMPOSITE WITH DEEP TRAPPING CENTERS ON THE INTERPHASE BOUNDARY

(75) Inventors: Mirza Abdul oglu Kurbanov, Baku (AZ); Azad Agalar Oglu Bayramov, Baku (AZ); Nuru Arab Oglu Safarov, Baku (AZ); Irada Sultanaxmed Gizi Sultanaxmedova, Baku (AZ); Sevinj Nadir Gizi Musaeva, Baku (AZ)

(73) Assignee: Malaxit Co., Baku (AZ)

( * ) Notice: Subject to any disclaimer, the term of this patent is extended or adjusted under 35 U.S.C. 154(b) by 0 days.

This patent is subject to a terminal disclaimer.

(21) Appl. No.: 12/751,458

(22) Filed: Mar. 31, 2010

(65) Prior Publication Data

US 2011/0240908 A1   Oct. 6, 2011

(51) Int. Cl.
*C04B 35/00*   (2006.01)
*C04B 35/495*   (2006.01)

(52) U.S. Cl. ............... 252/62.9 R; 252/62.9 PZ

(58) Field of Classification Search ............ 252/62.9 R, 252/62.39 PZ, 62.9 PZ; 307/400; 367/170; 264/436; 29/886
See application file for complete search history.

(56) References Cited

U.S. PATENT DOCUMENTS

| | | | |
|---|---|---|---|
| 4,046,704 A | | 9/1977 | Sumita |
| 4,128,489 A | * | 12/1978 | Seo .......................... 252/62.9 R |
| 4,291,245 A | | 9/1981 | Nowlin et al. |
| 4,626,263 A | | 12/1986 | Inoue et al. |
| 5,112,677 A | * | 5/1992 | Tani et al. ....................... 442/60 |
| 6,238,466 B1 | | 5/2001 | Rousseau et al. |
| 6,573,205 B1 | | 6/2003 | Myers et al. |
| 6,787,238 B2 | * | 9/2004 | Zhang et al. ................... 428/421 |
| 6,893,990 B2 | * | 5/2005 | Myers et al. ................... 442/414 |
| 7,498,699 B2 | | 3/2009 | Chiang et al. |
| 2003/0179617 A1 | * | 9/2003 | Gudesen et al. .............. 365/200 |
| 2004/0227985 A1 | * | 11/2004 | Kishi et al. .................... 359/296 |
| 2006/0022604 A1 | * | 2/2006 | Takeuchi et al. ........... 315/169.3 |
| 2008/0249269 A1 | * | 10/2008 | Chin et al. ..................... 526/208 |
| 2008/0290315 A1 | * | 11/2008 | Lee et al. ............... 252/62.9 PZ |

FOREIGN PATENT DOCUMENTS

| | | |
|---|---|---|
| CN | 101073751 A | 11/2007 |
| JP | 2005119938 A | 5/2005 |

OTHER PUBLICATIONS

'Matrix Active Micro- and Nanocomposites Based on the Polymer Semiconductive and Ferropiezoceramic materials', Kerimov et al., Aug. 2011, InTech, pp. 375-404.*

* cited by examiner

*Primary Examiner* — Jerry Lorengo
*Assistant Examiner* — Lynne Edmondson
(74) *Attorney, Agent, or Firm* — Haynes and Boone, LLP; Pavel I. Pogodin

(57) ABSTRACT

An electret composite comprising a polymer matrix material that contains particles of a piezoelectric material with deep trapping centers on the interphase boundaries between the matrix and particles of a piezoelectric material. The piezoelectric material may have a tetragonal or a rhombohedral structure, and the polymer matrix material may be selected from high-density polyethylene, polyvinylidene fluoride, and a copolymer of vinylidenechloride and tetrafluoroethylene. The composite has a potential difference>500V, lifespan>10 years, dielectric permeability$\geq$20, specific electric resistance$\geq 10^{14}$ Ohm·m; provision of deep trapping centers on the interphase boundaries with activation energy in the range of 1 to 1.25 eV, and stable electret charge.

18 Claims, No Drawings

ELECTRET COMPOSITE WITH DEEP TRAPPING CENTERS ON THE INTERPHASE BOUNDARY

FIELD OF THE INVENTION

The present invention relates to a composite material based on an electret-type polymer matrix and a piezoelectric material contained in the matrix. More specifically, the invention relates to the electret composite of the aforementioned type that has deep trapping centers on the boundaries between the phases. The composite material of the invention may find wide industrial application, e.g., in the manufacture of robots, acoustoelectric transducers, communication systems, information writing and storing systems, electrical measuring instruments, etc.

BACKGROUND OF THE INVENTION

An electret is a solid dielectric that exhibits persistent dielectric polarization. In particular, an electret is a solid dielectric with a quasi-permanent electric moment. Electrets may be classified as real-charge electrets and dipolar-charge electrets. Real-charge electrets are dielectrics with charges of one polarity at or near one side of the dielectric and charges of opposite polarity at or near the other side, while dipolar-charge electrets are dielectrics with aligned dipolar charges. Some dielectrics are capable of storing both real and dipolar charges.

U.S. Pat. No. 4,046,704 issued to I. Sumita in 1977 discloses a high polymer electret comprising one member of poly-3,3-bis(chloromethyl)oxacyclobutane, poly-3,3-bis-(fluoromethyl)oxacyclobutane and poly-3,3-bis(bromoethyl) oxacyclobutane group. It possesses stability. A disadvantage of this material is that stability of this material is unpredictable because of its multicomponent structure. Another drawback of this multicomponent material is strong dependence on properties of the components.

Also known in the art is a method of preparation of a polymer electret described in U.S. Pat. No. 4,291,245 issued T. Nowlin, et al., in 1981. The method comprises the following steps: (a) providing a parylene film having one side affixed to a metal layer and grounding said metal layer; (b) charging the free side of the film with a direct current corona, the charge being of sufficient magnitude to convert the film to an electret; (c) providing p-xylylene monomer vapor in sufficient amount to coat the charged film; and (d) introducing the vapor from step (c) and the electret into a deposition zone, said zone being under vacuum and at a temperature at which the vapor will condense, whereby the electret is conformally coated with parylene. Its disadvantages include complex technology and multistage preparing, as well as existing unstable low organic compounds in the composition that reduce the life of the electret.

Known in the art is another polymer electret described in U.S. Pat. No. 4,626,263 to N. Inoue, et al., in 1981. The electret comprises 60 to 99% of non-polar polymer, 0.5 to 39.5% of polar polymer, and 0.5 to 20% of at least one component selected from the group consisting of (A) a non-polar polymer modified with an unsaturated carboxylic acid or a derivative thereof, (B) a non-polar polymer modified with an unsaturated epoxy monomer and (C) a non-polar polymer modified with a silane monomer having an olefinically unsaturated bond. In this electret, a high charge density can be maintained stably over a long period, and this electret can be easily formed into a film. An air filter prepared from this electret has excellent dust collecting efficiency. Its disadvantages include complex compounds, limited temperature range of stability, and instability in a heterocharge relaxor state caused by orientation of the polar polymer component during electrothermopolarization.

U.S. Pat. No. 6,573,205 issued to D. Myers, et al., in 2003 describes a porous polymeric sheet having an electrostatic charge and comprising a zero-three composite of a polymeric matrix and a ferroelectric material dispersed therein. The polymeric component comprises a non-polar thermoplastic polymer, such as a polyolefin, and a second thermoplastic polymer having polar functional units, such as a telomer. The composite material is formed into a porous sheet and is electrically or corona poled to create an electret material which is well suited for use in various filtration, air-masking and dust wipe applications. Its disadvantages included using barium titanate, barium titanate strontium, lead titanate and solid solutions based on their ferroelectric phase; as well as having relatively low Curie temperature and unstable domain structure.

U.S. Patent Application Publication 20080249269 (published in 2008 and invented by H. Chin, et al.) describes a polymer electret with outstanding thermal and charge stability. The electret materials comprise a melt blend of a thermoplastic polymer and one or more compounds selected from the aromatic trisamides. The aromatic trisamides are for example of the formula. The melt blends are subjected to an electret treatment, for example a corona treatment. The electret materials are for example nonwoven polyolefin webs and are employed as filter materials, wipes, absorbent materials, filter masks, acoustic materials, printing substrates, measuring devices or contactless switches. The electret materials may also comprise an additive selected from a hindered amine light stabilizers and hydroxyphenylalkylphosphonic esters or monoesters. Disadvantages of such electrets include complex manufacturing, use of low-molecular-weight aromatic materials, and unpredictability in formation of a system comprising homo- and heterocharges that define electret properties.

The known polymer electrets, however, possess a number of disadvantages such as low potential difference, relatively short lifespan, insufficient dielectric permeability and electric resistance, complexity of manufacture, and a multicomponent composition.

BRIEF SUMMARY OF THE INVENTION

An electret composite of the present invention is free of the disadvantages inherent in the known polymer electrets and is additionally characterized by having deep trapping centers on the interphase boundaries. The polymer electret composite of the invention comprises a matrix of high-density polyethylene or a fluorine-containing polymers and a piezoelectric material that may have various structures.

According to one aspect of the invention, an electret composite may comprise a high-density polyethylene matrix and a piezoelectric material having a tetragonal structure (PZT-8), where PZT-8 stands for piezoelectric ceramic material of the type $PbTiO_3$—$PbZrO_3$—$PbNb_{2/3}Zn_{1/2}O_3$—$PbNb_{2/3}Mn_{1/3}O_3$.

According to another aspect of the invention, an electret composite may comprise a high-density polyethylene matrix and a piezoelectric material having a rhombohedral structure (PZT-5A), where PZT-5A stands for a piezoelectric ceramic material of the type $PbTiO_3$—$PbZrO_3$—$PbNb_{2/3}Zn_{1/3}O_3$—$PbNb_{2/3}Mg_{1/3}O_3$—$MnO_2$.

According to a third aspect of the invention, an electret composite may comprise a polyvinylidene fluoride matrix and a piezoelectric ceramic material with tetragonal structure (PZT-8).

According to a fourth aspect of the invention, an electret composite may comprise a polyvinylidene fluoride matrix and a piezoelectric ceramic with rhombohedral structure (PZT-5A).

According to a fifth aspect of the invention, an electret composite may comprise a polyvinylidene chloride matrix and a piezoelectric ceramic material with tetragonal structure (PZT-8).

According to a sixth aspect of the invention, an electret composite may comprise a matrix of copolymer vinylidene-chloride and tetrafluoroethylene and a piezoelectric ceramic with tetragonal structure (PZT-8), where tetrafluoroethylene is $[—CH_2—CF_2—]_n+[—CF_2—CF_2—]_n$, wherein "n" is a degree of polymerization ranging from 1000 to 10000.

According to a seventh aspect of the invention, an electret composite may comprise a matrix of copolymer vinylidene-chloride and tetrafluoroethylene and a piezoelectric ceramic with rhombohedral structure (PZT-8).

The polymer-piezoceramic type electret composite of the invention with deep trapping centers on the boundaries between the phases may have the following characteristics:
- potential difference>500V;
- lifespan>10 years;
- dielectric permeability$\geq$20;
- specific electric resistance$\geq 10^{14}$ Ohm·m;
- high electric capacity of electret material (due to dielectric permeability $\in$ equal to or greater than 20); for example, electric capacity of the electret composite of the invention may have a value which is three times greater than electric capacity of polyvinylidene fluoride having the highest value of dielectric permeability ($\in$=10) among other known polymers; electric capacity C being determined by the following formula: $C=\in_0·\in·S/d$, wherein S is an area, and d is a thickness of the electret composite
- provision of deep trapping centers on the interphase boundaries with activation energy in the range of 1 to 1.25 eV.
- stable electret charge with density of $6·10^{-4}$ C/m$^2$.

DETAILED DESCRIPTION

An electret polymer-piezoelectric composite of the invention with deep trapping centers on the interphase boundaries comprises a polymer matrix material, such as a high-density polyethylene or a fluorine-containing polymers and a piezoelectric material that may have various structures. The electret composite of the invention possesses a number of advantages as compared to known electret composites, such as 1) high potential difference, 2) high relaxation time (lifespan); 3) relatively high dielectric permeability; 4) high specific electric resistance; 5) simplicity of manufacturing technique, 6) fewer number of ingredients; 7) use of piezoelectric materials as ferroelectric phase with stable domain structure and high Curie temperature.

According to one aspect of the invention, an electret composite may comprise a high-density polyethylene matrix and a piezoelectric material having a tetragonal structure (PZT-8), where PZT-8 stands for piezoelectric ceramic material of the type $PbTiO_3—PbZrO_3—PbNb_{2/3}Zn_{1/2}O_3—PbNb_{2/3}Mn_{1/3}O_3$.

According to another aspect of the invention, an electret composite may comprise a high-density polyethylene matrix and a piezoelectric material having a rhombohedral structure (PZT-5A); where PZT-5A stands for a piezoelectric ceramic material of the type $PbTiO_3—PbZrO_3—PbNb_{2/3}Zn_{1/3}O_3—PbNb_{2/3}Mg_{1/3}O_3—MnO_2$.

According to a third aspect of the invention, an electret composite may comprise a polyvinylidene fluoride matrix and a piezoelectric ceramic material with tetragonal structure (PZT-8).

According to a fourth aspect of the invention, an electret composite may comprise a polyvinylidene fluoride matrix and a piezoelectric ceramic with rhombohedral structure (PZT-5A).

According to a fifth aspect of the invention, an electret composite may comprise a polyvinylidene chloride matrix and a piezoelectric ceramic material with tetragonal structure (PZT-8).

According to a sixth aspect of the invention, an electret composite may comprise a matrix of copolymer vinylidene-chloride and tetrafluoroethylene and a piezoelectric ceramic with tetragonal structure (PZT-8), where tetrafluoroethylene is $[—CH_2—CF_2—]_n+[—CF_2—CF_2—]_n$.

According to a seventh aspect of the invention, an electret composite may comprise a matrix of copolymer vinylidene-chloride and tetrafluoroethylene and a piezoelectric ceramic with rhombohedral structure (PZT-5A).

Stability of electret properties of the composite of the invention results from the formation of a quasi-neutral system on the interphase boundaries. The aforementioned system consists of electrons on the interphase boundary injected during electrothermopolarization and piezophase domains orientation under the effect of local field of the injected charge carriers.

The deep ionized trapping centers are obtained on the interphase boundaries by a method that comprises the following steps: crystallizing the electret composite under conditions of electric-charge plasma in air thus forming oxidizing centers in the polymer phase; locally ionizing the polymer matrix material at deep levels on the interphase boundaries by cycle electrothermopolarization; and neutralizing the polymer matrix at the local levels of low polymer-phase activation energy by thermal cleaning. What is meant here by the term "thermal cleaning" is a neutralization of shallow traps with activation energy less than 0.5 eV.

EXAMPLES

Example 1

A sample of each electret polymer-piezoelectric composite comprising high-density polyethylene and PZT-8 ceramic was prepared by hot pressing. Deep ionized trapping centers on the interphase boundaries of this composite were formed by subjecting the prepared sample to the effect of crystallization sample in condition of acting plasma of an electric discharge and subsequent electrothermal treatment. The treated sample was polarized, and spectra of thermostimulated depolarizing current were measured. The electret potential difference and density of electret charges were also measured, and relaxation time of the electret state was determined. In almost all cases, the potential difference produced by the electret material (hereinafter referred to as "potential difference") remained practically the same during the lifespan of the electret state of the composite material and had a value exceeding 500 V. Polarization of electrets was carried out for 0.5 hours at an electric field intensity $E_f$ of 2.5 to 8 MV/m and in the temperature range $T_n$ of 373 to 413 K. The measured specific electric resistance was greater than $10^{14}$ Ohm·m. Parameters of the given electret composites are shown in Table 1.

TABLE 1

Characteristics of electrets and modes of polarization

| Composites | Modes of polarization | | | Q, $10^{-5}$ C/m$^2$ | τ (years) | Treatment modes |
| --- | --- | --- | --- | --- | --- | --- |
| | $E_f$, MV/m | $T_n$, K | $t_{n,hour}$ | | | |
| high-density polyethylene - PZT-8 | 8 | 373 | 0.5 | 2.2 | 6 | — |
| high-density polyethylene - PZT-8 | 7.5 | 373 | 0.5 | 5 | 9 | Plasma-crystallized |
| high-density polyethylene - PZT-8 | 8 | 373 | 0.5 | 8.7 | 11-12 | Plasma-crystallized and electro-thermally treated |

Q is a density of electret charge,
τ is a lifetime of the electret (years);
$T_n$, is a polarization temperature (° K);
$t_n$ is polarization time (hours).

Example 2

A sample of an electret polymer-piezoelectric composite comprising high-density polyethylene and PZT-5A ceramic was prepared by hot pressing. Formation of deep ionized trapping centers on the interphase boundary of the composite was carried out under conditions of electric discharge plasma and electrothermal treatment. The obtained sample was polarized, and spectra of thermostimulated depolarizing current were measured. The electret potential difference and density of electret charges were also measured, and relaxation time of the electret state was determined. Polarization of electrets was carried out for 0.5 hours at electric field intensity $E_f$ of 2.5 to 10 MV/m and in the temperature range $T_n$ of 350 to 450 K. Parameters of given electret composites are shown in Table 2.

TABLE 2

Characteristics of electrets and modes of polarization

| Composites | Modes of polarization | | | Q, $10^{-5}$ C/m$^2$ | τ (years) | Treatment modes |
| --- | --- | --- | --- | --- | --- | --- |
| | $E_n$, MV/m | $T_n$, K | $t_{n,hour}$ | | | |
| high-density polyethylene - PZT-5A | 8 | 373 | 0.5 | 2.8 | 6.5 | — |
| high-density polyethylene - PZT-5A | 8 | 373 | 0.5 | 5.7 | 8.5 | Plasma-crystallized |
| high-density polyethylene - PZT-5A | 8 | 373 | 0.5 | 6.7 | 10-11 | Plasma-crystallized and electro-thermally treated |

Q is a density of electret charge,
τ is a lifetime of the electret (years);
$T_n$, is a polarization temperature (° K);
$t_n$ is polarization time (hours).

Example 3

A sample of each electret polymer-piezoelectric composite comprising a polyvinylidene fluoride and PZT-8 ceramic was prepared by hot pressing. Formation of deep ionized trapping centers on the interphase boundary of the composite was carried out under conditions of condition of electric discharge plasma and by electrothermal treatment. The obtained sample was polarized, and spectra of thermostimulated depolarizing current were measured. The electret potential difference and density of electret charges were also measured, and relaxation time of the electret state was determined. Polarization of electrets was carried out for 0.5 hours at electric field intensity $E_f$ of 2.5 to 10 MV/m and in the temperature range $T_n$ of 350 to 450 K. Parameters of given electret composites are shown in Table 3.

TABLE 3

Characteristics of electrets and modes of polarization

| Composites | Modes of polarization | | | Q, $10^{-5}$ C/m$^2$ | τ (years) | Treatment modes |
| --- | --- | --- | --- | --- | --- | --- |
| | $E_n$, MV/m | $T_n$, K | $t_{n,hour}$ | | | |
| polyvinylidene fluoride - PZT-8 | 6 | 413 | 0.5 | 2.0 | 0.5 | — |
| polyvinylidene fluoride - PZT-8 | 6 | 413 | 0.5 | 7.5 | 9-10 | Plasma-crystallized |
| polyvinylidene fluoride - PZT-8 | 6 | 413 | 0.5 | 8.0 | 11-13 | Plasma-crystallized and electro-thermally treated |

Q is a density of electret charge,
τ is a lifetime of the electret (years);
$T_n$, is a polarization temperature (° K);
$t_n$ is polarization time (hours).

Example 4

A sample of each electret polymer-piezoelectric composite comprising a polyvinylidene fluoride and PZT-5A ceramic was prepared by hot pressing. Formation of deep ionized trapping centers on the interphase boundary of the composite was carried out under conditions of electric discharge plasma and by electrothermal treatment. The obtained sample was polarized, and spectra of thermostimulated depolarizing current were measured. The electret potential difference and density of electret charges were also measured, and relaxation time of the electret state was determined. Polarization of electrets was carried out for 0.5 hours at electric field intensity $E_f$ of 2.5 to 10 MV/m and in the temperature range $T_n$ of 350 to 450 K. Parameters of the given electret composites are shown in Table 4.

TABLE 4

Characteristics of electrets and modes of polarization

| Composites | Modes of polarization | | | Q, $10^{-5}$ C/m$^2$ | τ, year | Treatment modes |
| --- | --- | --- | --- | --- | --- | --- |
| | $E_n$, MV/m | $T_n$, K | $t_{n,hour}$ | | | |
| polyvinylidene fluoride - PZT-5A | 6.5 | 413 | 0.5 | 2.0 | 2-3 | — |
| polyvinylidene fluoride - PZT-5A | 6 | 413 | 0.5 | 5.6 | 9-10 | Plasma-crystallized |
| polyvinylidene fluoride - PZT-5A | 6 | 413 | 0.5 | 8.0 | 11-12 | Plasma-crystallized and electro-thermally treated |

Q is a density of electret charge,
τ is a lifetime of the electret (years);
$T_n$, is a polarization temperature (° K);
$t_n$ is polarization time (hours).

Example 5

A sample of each electret polymer-piezoelectric composite comprising a polyvinylidene chloride and PZT-8 ceramic was prepared by hot pressing. Formation of deep ionized trapping centers on the interphase boundary of the composite was carried out under conditions of electric discharge plasma and electrothermal treatment. The obtained sample was polarized, and spectra of thermostimulated depolarizing current were measured. The electret potential difference and density of electret charges were also measured, and relaxation time of the electret state was determined. Polarization of electrets was carried out for 0.5 hours at electric field intensity $E_f$ of 2.5 to 10 MV/m and in the temperature range $T_n$ of 350 to 450 K. Parameters of the given electret composites are shown in Table 5.

TABLE 5

Characteristics of electrets and modes of polarization

| Composites | Modes of polarization | | | Q, $10^{-5}$ C/m² | $\tau$, year | Treatment modes |
|---|---|---|---|---|---|---|
| | $E_n$, MV/m | $T_n$, K | $t_{n,hour}$ | | | |
| polyvinylidene chloride - PZT-8 | 5 | 413 | 0.5 | 2.2 | 0.8 | — |
| polyvinylidene chloride - PZT-8 | 5 | 413 | 0.5 | 7.8 | 10-11 | Plasma-crystallized |
| polyvinylidene chloride - PZT-8 | 5 | 413 | 0.5 | 8.2 | 12-13 | Plasma-crystallized and electro-thermo-treated |

Q is a density of electret charge,
$\tau$ is a lifetime of the electret (years);
$T_n$ is a polarization temperature (° K);
$t_n$ is polarization time (hours).

Example 6

A sample of each electret polymer-piezoelectric composite comprising a copolymer vinylidene-chloride and tetrafluoro-ethylene and PZT-8 ceramic was prepared by hot pressing. Formation of deep ionized trapping centers on the interphase boundary of the composite was carried out under conditions of electric discharge plasma and by electrothermal treatment. The obtained sample was polarized, and spectra of thermo-stimulated depolarizing current were measured. The electret potential difference and density of electret charges were also measured, and relaxation time of the electret state was determined. Polarization of electrets was carried out for 0.5 hours at electric field intensity $E_f$ of 2.5 to 10 MV/m and in the temperature range $T_n$ of 350 to 450 K. Parameters of given electret composites are shown in Table 6.

TABLE 6

Characteristics of electrets and modes of polarization

| Composites | Modes of polarization | | | Q, $10^{-5}$ C/m² | $\tau$, year | Treatment modes |
|---|---|---|---|---|---|---|
| | $E_n$, MV/m | $T_n$, K | $t_{n,hour}$ | | | |
| Copolymer of vinylidene-chloride and tetrafluoro-ethylene - PZT-8 | 6 | 433 | 0.5 | 3.0 | 2-4 | — |
| Copolymer of vinylidene-chloride and tetrafluoro-ethylene - PZT-8 | 6 | 433 | 0.5 | 5.6 | 6 | Plasma-crystallized |
| Copolymer of vinylidene-chloride and tetrafluoro-ethylene - PZT-8 | 6 | 433 | 0.5 | 8.0 | 11-13 | Plasma-crystallized and electro-thermally treated |

Q is a density of electret charge,
$\tau$ is a lifetime of the electret (years);
$T_n$ is a polarization temperature (° K);
$t_n$ is polarization time (hours).

Example 7

A sample of each electret polymer-piezoelectric composite comprising a copolymer vinylidene-chloride and tetrafluoro-ethylene and PZT-5A ceramic was prepared by hot pressing. Formation of deep ionized trapping centers on the interphase boundary of the composite was carried out under conditions of electric discharge plasma and electrothermal treatment. The obtained sample was polarized, and spectra of thermo-stimulated depolarizing current were measured. The electret potential difference and density of electret charges were also measured, and relaxation time of the electret state was determined. Polarization of electrets was carried out for 0.5 hours at electric field intensity $E_f$ of 2.5 to 10 MV/m and in the temperature range $T_n$ of 350 to 450 K. Parameters of given electret composites are shown in table 7.

TABLE 7

Characteristics of electrets and modes of polarization

| Composites | Modes of polarization | | | Q, $10^{-5}$ C/m² | $\tau$, year | Treatment modes |
|---|---|---|---|---|---|---|
| | $E_n$, MV/m | $T_n$, K | $t_{n,hour}$ | | | |
| Copolymer of vinylidene-chloride and tetrafluoro-ethylene - PZT-5a | 6 | 433 | 0.5 | 2.0 | 3-4 | — |
| Copolymer of vinylidene-chloride and tetrafluoro-ethylene - PZT-5a | 6 | 433 | 0.5 | 5.7 | 9 | Plasma-crystallized |

TABLE 7-continued

| | Characteristics of electrets and modes of polarization | | | | | |
|---|---|---|---|---|---|---|
| | Modes of polarization | | | Q, | | |
| Composites | $E_n$, MV/m | $T_n$, K | $t_{n,hour}$ | $10^{-5}$ C/m$^2$ | $\tau$, year | Treatment modes |
| Copolymer of vinylidene-chloride and tetrafluoro-ethylene - PZT-5a | 6 | 433 | 0.5 | 8.0 | 11-13 | Plasma-crystallized and electro-thermally treated |

Q is a density of electret charge,
$\tau$ is a lifetime of the electret (years);
$T_n$, is a polarization temperature (° K);
$t_n$ is polarization time (hours).

Although the invention has been shown and described with reference to specific embodiments, it is understood that these embodiments should not be construed as limiting the areas of application of the invention and that any changes and modifications are possible provided that these changes and modifications do not depart from the scope of the attached patent claims.

The invention claimed is:

1. An electret composite comprising a polymer matrix material that contains particles of a piezoelectric material with deep trapping centers on the interphase boundaries between the matrix and particles of a piezoelectric material, the electret composite having the characteristics of:
   potential difference≧500V;
   lifespan>10 years;
   dielectric permeability≧20;
   specific electric resistance≧$10^{14}$ Ohm·m;
   provision of deep trapping centers on the interphase boundaries with activation energy in the range of 1 to 1.25 eV, and
   stable electret charge with density ranging from $2.2 \cdot 10^{-5}$ to $8.7 \cdot 10^{-5}$ C/m$^2$.

2. The electret composite of claim 1, wherein the polymer matrix material is selected from the group consisting of a high-density polyethylene and a fluorine-containing polymers, and wherein the piezoelectric material is a piezoelectric ceramic material of a PZT-8 type.

3. The electret composite of claim 2, wherein the piezoelectric ceramic material has a tetragonal structure.

4. The electret composite of claim 3, wherein the piezoelectric ceramic material of a PZT-8 type is expressed by the following formula: $PbTiO_3$—$PbZrO_3$—$PbNb_{2/3}Zn_{1/3}O_3$—$PbNb_{2/3}Mn_{1/3}O_3$.

5. The electret composite of claim 1, wherein the polymer matrix material comprises a high-density polyethylene and a piezoelectric material has a rhombohedral structure.

6. The electret composite of claim 5, wherein the piezoelectric material is a piezoelectric ceramic material of a PZT-5A.

7. The electret composite of claim 6, wherein the piezoelectric ceramic material of a PZT-5A is expressed by the following formula: $PbTiO_3$—$PbZrO_3$—$PbNb_{2/3}Zn_{1/3}O_3$—$PbNb_{2/3}Mg_{1/3}O_3$—$MnO_2$.

8. The electret composite of claim 1, wherein the polymer matrix material comprises a polyvinylidene fluoride and a piezoelectric material comprises a piezoelectric ceramic material of a PZT-8 type that has a tetragonal structure.

9. The electret composite of claim 8, wherein the piezoelectric ceramic material of a PZT-8 type is expressed by the following formula: $PbTiO_3$—$PbZrO_3$—$PbNb_{2/3}Zn_{1/3}O_3$—$PbNb_{2/3}Mn_{1/3}O_3$.

10. The electret composite of claim 1, wherein the polymer matrix material comprises a polyvinylidene fluoride and a piezoelectric material comprises a piezoelectric ceramic material of a PZT-5A type that has a rhombohedral structure.

11. The electret composite of claim 10, wherein the piezoelectric ceramic material of a PZT-5A is expressed by the following formula: $PbTiO_3$—$PbZrO_3$—$PbNb_{2/3}Zn_{1/3}O_3$—$PbNb_{2/3}Mg_{1/3}O_3$—$MnO_2$.

12. The electret composite of claim 1, wherein the polymer matrix material comprises a copolymer of vinylidenechloride and tetrafluoroethylene, and wherein the piezoelectric ceramic material has a tetragonal structure.

13. The electret composite of claim 12, wherein the tetrafluoroethylene is represented by the following formula [—$CH_2$—$CF_2$—]$_n$+[—$CF_2$—$CF_2$—]$_n$, wherein "n" is a degree of polymerization ranging from 1000 to 10000.

14. The electret composite of claim 13, wherein the piezoceramic material comprises a piezoelectric ceramic material of a PZT-8 type that has a rhombohedral structure.

15. The electret composite of claim 14, wherein the piezoelectric ceramic material of a PZT-8 type is expressed by the following formula: $PbTiO_3$—$PbZrO_3$—$PbNb_{2/3}Zn_{1/3}O_3$—$PbNb_{2/3}Mn_{1/3}O_3$.

16. The electret composite of claim 1, wherein the deep trapping centers comprise more than two trapping centers formed under conditions of electric discharge plasma and electrothermal treatment.

17. The electret composite of claim 4, wherein the deep trapping centers comprise more than two trapping centers formed under conditions of electric discharge plasma and electrothermal treatment.

18. The electret composite of claim 11, wherein the deep trapping centers comprise more than two trapping centers formed under conditions of electric discharge plasma and electrothermal treatment.

* * * * *